(12) United States Patent
Nuttinck et al.

(10) Patent No.: US 8,362,561 B2
(45) Date of Patent: Jan. 29, 2013

(54) TRANSISTOR DEVICE AND METHOD OF MANUFACTURING SUCH A TRANSISTOR DEVICE

(75) Inventors: Sebastien Nuttinck, Heverlee (BE); Gilberto Curatola, Korbek-Lo (BE)

(73) Assignee: NXP B.V., Eindhoven (NL)

( * ) Notice: Subject to any disclaimer, the term of this patent is extended or adjusted under 35 U.S.C. 154(b) by 729 days.

(21) Appl. No.: 12/519,162

(22) PCT Filed: Dec. 10, 2007

(86) PCT No.: PCT/IB2007/054990
§ 371 (c)(1), (2), (4) Date: Jun. 13, 2009

(87) PCT Pub. No.: WO2008/072164
PCT Pub. Date: Jun. 19, 2008

(65) Prior Publication Data
US 2010/0025766 A1 Feb. 4, 2010

(30) Foreign Application Priority Data
Dec. 15, 2006 (EP) ..................................... 06026030

(51) Int. Cl.
*H01L 27/12* (2006.01)
(52) U.S. Cl. ... 257/351; 257/34; 257/367; 257/E21.442; 257/E21.561; 257/E29.275
(58) Field of Classification Search .................. 438/157, 438/283; 257/66, 34, 367, E21.442, E29.275, 257/351, E21.561
See application file for complete search history.

(56) References Cited

U.S. PATENT DOCUMENTS

| | | | |
|---|---|---|---|
| 5,179,037 A | 1/1993 | Seabaugh | |
| 6,413,802 B1 * | 7/2002 | Hu et al. | 438/151 |
| 6,433,609 B1 | 8/2002 | Voldman | |

(Continued)

FOREIGN PATENT DOCUMENTS

| | | |
|---|---|---|
| JP | 6 177367 A | 6/1994 |
| WO | 2005/055326 A | 6/2005 |

(Continued)

OTHER PUBLICATIONS

Bhuwelka, K.K., et al; "Scaling the Vertical Tunnel Fet With Tunnel Bandgap Modulation and Gate Workfunction Engineering"; IEEE Transactions on Electron Devices, vol. 52, No. 5; pp. 909-917.

(Continued)

*Primary Examiner* — Stephen W Smoot
*Assistant Examiner* — Vicki B Booker

(57) ABSTRACT

A transistor device (10), the transistor device (10) comprising a substrate (11, 14), a fin (3, 3A) aligned along a horizontal direction on the substrate (11, 14), a first source/drain region (4) of a first type of conductivity in the fin (3, 3A), a second source/drain region (5) of a second type of conductivity in the fin (3, 3A), wherein the first type of conductivity differs from the second type of conductivity, a channel region (33) in the fin (3, 3A) between the first source/drain region (4) and the second source/drain region (5), a gate insulator (6) on the channel region (33), and a gate structure (7, 8) on the gate insulator (6), wherein the sequence of the first source/drain region (4), the channel region (33) and the second source/drain region (5) is aligned along the horizontal direction.

20 Claims, 5 Drawing Sheets

U.S. PATENT DOCUMENTS

| | | | |
|---|---|---|---|
| 6,764,884 B1 | 7/2004 | Yu et al. | |
| 6,767,793 B2 * | 7/2004 | Clark et al. | 438/286 |
| 6,815,738 B2 * | 11/2004 | Rim | 257/256 |
| 6,853,020 B1 | 2/2005 | Yu et al. | |
| 6,911,697 B1 | 6/2005 | Wang et al. | |
| 7,605,028 B2 * | 10/2009 | Mouli | 438/157 |
| 2006/0113612 A1 * | 6/2006 | Gopalakrishnan et al. | 257/392 |
| 2006/0244077 A1 | 11/2006 | Nowak | |
| 2006/0273372 A1 | 12/2006 | Voldman | |
| 2007/0029623 A1 | 2/2007 | Liu et al. | |

FOREIGN PATENT DOCUMENTS

| | | |
|---|---|---|
| WO | 2006/087044 A | 8/2006 |
| WO | 2007/120296 A2 | 10/2007 |

OTHER PUBLICATIONS

Nowak, E., et al; "Turning Silicon on Its Edge"; IEEE Circuits and Devices Magazine; Jan./Feb. 2004; p. 20.

Nirschl, T., et al; "The Tunneling Field Effect Transistor (TFET): The Temperature Dependence, the Simulation Model, and Its Application"; ISCAS 2004; p. 713.

Hansch, W.; "A Vertical MOS Gated Esaki Tunneling Transistor in Silicon"; Thin Solid Films 369; 2000;, pp. 387-389.

Reddick, W.; Elsevier Publication; "Silicon Surface Tunnel Transistor"; Appl. Phys. Lett., 67 (4); Jul. 1995; p. 494.

Mathew, L., et al.: Finfet with isolated n+ and p+ gate regions strapped with metal and polysilicon, 2003; IEEE International SOI Conference; Sep. 29, 2003; pp. 109-110.

\* cited by examiner ical direction on a substrate, forming a first source/drain region of a first type of conductivity in the fin, forming a second source/drain region of a second type of conductivity in the fin, wherein the first type of conductivity differs from the second type of conductivity, forming a channel region in the fin between the first source/drain region and the second source/drain region, forming a gate insulator on the channel region, forming a gate structure on the gate insulator, and forming the

TRANSISTOR DEVICE AND METHOD OF MANUFACTURING SUCH A TRANSISTOR DEVICE

FIELD OF THE INVENTION

The invention relates to a transistor device.
The invention further relates to a method of manufacturing a transistor device.

BACKGROUND OF THE INVENTION

A FinFET (=Fin Field Effect Transistor) may provide a proper drive current and may avoid so-called short-channel-effects that limit the performance of a FET.

U.S. Pat. No. 6,413,802 discloses a FinFET device fabricated using conventional planar MOSFET technology. The device is fabricated in a silicon layer overlying an insulating layer (for instance, SIMOX) with the device extending from the insulating layer as a fin. Double gates are provided over the sides of the channel to provide enhanced drive current and effectively suppress short channel effects. A plurality of channels can be provided between a source and a drain for increased current capacity. Two transistors can be stacked in a fin to provide a CMOS transistor pair having a shared gate.

Bhuwelka, K. N. et al. 2005, "Scaling the Vertical Tunnel FET With Tunnel Bandgap Modulation and Gate Workfunction Engineering", IEEE Transactions on Electron Devices, Vol. 52, No. 5, pp. 909 to 917 discloses a vertical field effect transistor (FET) comprising a gated p-i-n diode showing gate-controlled band-to-band tunneling for a heavily doped source to an intrinsic channel.

Such conventional systems may lack suitability for high-scale integration with a simultaneous proper performance.

OBJECT AND SUMMARY OF THE INVENTION

It is an object of the present invention to provide a transistor device, which is suitable for high-scale integration while the performance of the device remains on a high level.

To achieve this, a transistor device and a method of manufacturing a transistor device according to the independent claims are provided.

According to an exemplary embodiment of the invention, a transistor device is provided, the transistor device comprising a substrate, a fin aligned along a horizontal direction on the substrate, a first source/drain region of a first type of conductivity in the fin, a second source/drain region of a second type of conductivity in the fin, wherein the first type of conductivity differs from the second type of conductivity, a channel region in the fin between the first source/drain region and the second source/drain region, a gate insulator on the channel region, and a gate structure on the gate insulator, wherein the sequence of the first source/drain region, the channel region and the second source/drain region is aligned along the horizontal direction.

According to another exemplary embodiment of the invention, a method of manufacturing a transistor device is provided, the method comprising aligning a fin along a horizon-sequence of the first source/drain region, the channel region and the second source/drain region to be aligned along the horizontal direction.

In the context of this application, the term "fin" may particularly denote a strip-like structure which may extend along essentially one direction, and which may be located on a planar surface of a (for instance semiconductor, particularly silicon) substrate or parallel to such a surface. Such a fin may by an oblong structure that may have an extension along one dimension being significantly larger than extensions along the two remaining dimensions.

The term "horizontal direction on the substrate" may denote an extension direction that lies in the surface plane of the (planar) substrate.

The term "first type of conductivity" and "second type of conductivity" may denote an N-doped region and a P-doped region, or vice versa. N-type doping may be obtained by implanting group-VI material such as Arsine, whereas P-type doping may be obtained by ion implantation using group-III material such as Aluminum.

The term "source/drain region" may denote a region adjacent the channel that may be doped and/or operated to serve as a source or as a drain.

A "differing conductivity" may denote a different doping concentration and/or a different doping type (namely an N-type doping and a P-type doping). Different types of conductivity may include conduction by different charge carriers, namely electrons and holes.

Exemplary embodiments of the present invention are based particularly on the following recognitions; the FinFET structure combined with a TFET (=Tunneling Field Effect Transistor) is very suitable for high-scale integration since on the one hand the fin structure allows for a small area occupation while short-channel effects are reduced. Use of a multi-fin structure may allow for a higher driving current. The incorporation of a TFET in the fin device may imply that the device contains a reverse biased diode if no gate bias is applied. In this way the static leakage current may be very low which may be appropriate in high integration devices. A TFET may also possess a very good short-channel behavior. Moreover a FinFET structure may allow for an easy provision of the device with a dual gate function. This may allow for an easy integration of both an N-type and a P-type TFET into one single fin. This may allow for a further reduction of the occupied area per transistor.

An advantage of a device according to an exemplary embodiment is that it may be suitable for high scale integration requiring a decreasing chip area occupation per single transistor while its performance benefits are not endangered.

A first exemplary embodiment of a device according to the invention is characterized in that an intrinsic semiconductor region forms the channel region. This may allow for the presence at the same time of both a N-TFET and a P-TFET and carrier transport in the channel region may be improved. A (highly) N-type doped semiconductor region may function as the drain region for the N-TFET and a (highly) P-type doped semiconductor region may function as the source region in such a case. In case of a P-TFET these regions may function as source and drain regions in that order.

In a further modification the device may comprise a first gate region present along a first vertical side of the strip-shaped semiconductor region and a second gate region along a second vertical side, opposite to the first vertical side, of the strip-shaped semiconductor region. This may allow for a well functioning of both the N-TFET and the P-TFET in one single fin.

The use of separate gate regions is not only simple to realize in a device according to an embodiment of the invention but it may also allow for improving the material of the gate regions for functioning in a N-TFET or in a P-TFET.

Therefore, a further exemplary embodiment is characterized in that the first gate region comprises a first material and the second gate comprises a second material different from the first material, the work function of the first material being suitable for a N-type tunneling field effect transistor and the work function of the second material being suitable for a P-type tunneling field effect transistor.

In a modification both gate regions are present on a horizontal (upper) side face of the strip-shaped semiconductor region. This allows for a simple manufacturing of a device according to an exemplary embodiment of the invention using directional deposition processes for forming both gate regions.

In a semiconductor device according to an exemplary embodiment of the invention the semiconductor body comprises a number of mutually parallel strip-shaped semiconductor regions. For the above-mentioned reason, realization of the semiconductor body as a silicon on insulator structure may be advantageous. Such a realization can be simply effected by selecting a silicon substrate provided with a buried oxide region as the starting point of the manufacturing.

In an exemplary embodiment the device functions to provide a logic function.

Although in a device according to an embodiment of the invention both gate regions can be provided with separate electrical connections, in a simple and easy to manufacture structure, both gate regions are connected to each other and thus share the same gate voltage. As a consequence only one transistor (in the same fin) can be turned on at a given time. The sharing of gate voltage however is not a problem since it is the case in most digital circuits. See in this respect the NAND gate and INVERTER that are the building blocks of digital circuits.

Any logic function can be built on either a NAND or a NOR. The basic NAND circuit (2 inputs, 1 output) may comprise 4 transistors, 2 P-MOSFETs and 2 N-MOSFETs. However such an approach is not the most efficient in terms of area and power consumption. In order to appropriately select these two parameters, use may be made of a library comprising standard cells. Such a library may contain 600 cells or more, but 80 percent of any function can be done using only twenty (20) cells or less. These cells are categorized with respect to drive strength, inputs, and functionality and are just a smarter circuit topology than the basic combination of simple NANDs. For instance a four (4) inputs NAND can be realized "inefficiently" using 3 standard NAND gates, or a smaller topology based on the standard NAND gate that results in the need of less transistors.

A method of manufacturing a semiconductor device with a substrate and a semiconductor body comprising a strip-shaped semiconductor region of silicon in which a field effect transistor is formed is provided according to an exemplary embodiment of the invention, wherein a source region, a channel region and a drain region are arranged in succession, seen in the longitudinal or horizontal direction of the strip shaped semiconductor region, and wherein the channel region is provided with a gate dielectric on top of which a gate electrode is formed along vertical sides of the strip-shaped semiconductor region, may be characterized according to an exemplary embodiment in that the source and drain regions are formed of semiconductor regions that are provided with opposite conductivity types.

An intrinsic semiconductor region may form the channel region. In this way both an N-TFET and a P-TFET can be realized in a single fin. The device may for that purpose be provided with a first gate region along a first vertical side of the strip-shaped semiconductor region and with a second gate region along a second vertical side, opposite to the first vertical side, of the strip-shaped semiconductor region.

A directional deposition process from two opposite directions may form the first and second gate regions. Source and drain regions may be formed by two implantations, the remainder of the device being provided with a mask during each implantation. According to an exemplary embodiment of the invention, N and P tunneling transistors embedded in a single fin may be provided. Such an integrated circuit may enable to combine in a single fin both N and P type tunneling transistors, resulting in a decrease of occupied silicon area for digital ICs.

An appropriate semiconductor technology for such a device is the CMOS technology (silicon based technology). This technology is appropriate for digital/logic circuits. One aspect that has made a success of this scheme of technology has been a successful downscaling of transistors, and allowed for a consistent increase in transistor density. However, traditional scaling of CMOS is coming to an end, and non-classical devices may be candidates to continue the scaling trend.

Exemplary embodiments of the invention combine the concepts of a finFET device (see for instance E. Nowak et al. "Turning Silicon on its edge", IEEE Circuits and Devices Magazine, January/February 2004, p. 20) and tunneling field effect transistors (see T. Nirschl et al, "The tunneling field effect transistor (TFET): the temperature dependence, the simulation model, and its application", ISCAS 2004, p. 713; W. Hansch, "A vertical MOS gated Esaki tunneling transistor in Silicon", Thin Solid Films 369, (2000), pp. 387 to 389, Elsevier Publication; W. Reddick, "Silicon Surface Tunnel Transistor" Appl. Phys. Lett., 67 (4), July 1995 p. 494). According to an exemplary embodiment, a transistor may be provided that results from a proper combination of both devices. It may enable to combine in a single fin both N and P type tunneling transistors, resulting in a decrease of the occupied silicon area for digital ICs.

Such a system may have advantages of TFET devices, namely a reverse biased pin-diode, if no gate bias voltage is applied. Such a diode may reduce the static leakage current by two orders of magnitude and more. Simultaneously, advantages of fin FET transistors may be obtained, particularly that the channel can be left undoped improving carrier transport, and that short channel effects may be better controlled than in bulk planar transistors (via fin geometry and because of the presence of multi-gates).

According to an exemplary embodiment of the invention, a device combining both an N-TFET and a P-TFET (necessary for complementary logic) in the same device may be provided in the shape of a fin(FET), thus allowing to reduce the occupied area.

Optionally, specific process steps can be added to this concept to have a different gate work function for the N-FET and the P-FET, enabling to properly tune the devices independently.

According to an exemplary embodiment, the N-transistor and the P-transistor may share the same gate and thus the same gate voltage. As a consequence, only one transistor (in the same fin) can be turned on at a time. The sharing of gate voltage is not a problem since it is the case in many digital circuits (see NAND gate and INVERTER).

According to an exemplary embodiment of the invention, the region below the gate may be left intrinsic. This may allow using this region as a channel for both the N- and the P-device. The source and drain contacts may be of opposite doping, for instance N++ and P++. Such an anti-asymmetry may allow the N++ region to be used for a drain contact in the case of N-TFET use, and to be used for a source contact in the case of P-TFET usage.

According to an exemplary embodiment, the gate material on different side portions of the fin (covered with a gate dielectric) can be different, allowing to select appropriate work functions for proper performance of the N-TFET and of the P-TFET. Thus, work function engineering may be applied in an appropriate manner.

A device may be provided being a tunneling FET based on the Esaki effect. According to an exemplary embodiment of the invention, a double gate structure in a finFET configuration may be provided, wherein the gate may be on the right and the left lateral sides of the fin, and the P++ and N++ regions may be (essentially) at the same horizontal level, forming first and second source/drain regions.

This may have the effect that the device can be ultimately processed using standard finFET technology procedures. A double gate feature may allow a better short channel control. Having the gate on opposing sides of the fin means that they may be aligned, which may be very difficult/impossible to achieve with a planer double gate. The effect that the N++ and P++ are on the same horizontal level (in contrast to a vertical device) may make it very easy to have proper doping in this region. The effect that both the gate and the source/drain regions can be viewed from the top may make it possible to use a double spacer fabrication technique to properly control the doping level and doping gradient at the N++/intrinsic interface and the P++/intrinsic interface. This may be advantageous to properly tune the tunneling mechanism. Such an effect may not be obtained in planar double gate architecture or in a vertical double gate configuration.

Next, further exemplary embodiments of the transistor device will be explained. However, these embodiments also apply to the method of manufacturing a transistor device.

The first type of conductivity may be opposite to the second type of conductivity. Particularly, one of the types of conductivity may be a P-type and the other one may be an N-type.

The gate structure may be a double gate structure. This double gate structure may comprise two portions in accordance with different work functions and may be located on a gate insulator through which the field effect may be mediated. A double gate structure may have a first gate portion aligned at least partially along a lateral vertical surface of the gate insulator, and a second gate portion may be aligned at least partially along a second lateral vertical surface of the gate insulator. Taking this measure may allow to operate a commonly controllable or adjustable gate region with two work functions. This may allow for a refined control of the device in different operation modes.

A material of the first gate portion may differ from a material of the second gate portion. For instance, any one of the one, two or more gate regions may be made of Si, Ru, Zr, Nb, Ta, MoSi, TaS, Ni, $RuO_2$, MoN or TaN.

A work function of the first gate portion may be adapted to provide a characteristic of an N-type tunneling field effect transistor. A work function of the material of the second gate portion may be adapted to provide a characteristic P-type tunneling field effect transistor. Therefore, a highly integrated CMOS-like structure may be provided.

A part of one or both of the first gate portion and the second gate portion may be aligned partially along a vertical surface of the gate insulator, therefore being essentially L-shaped. Particularly, the two gate portions may be provided partially on top of one another, so that, on the top of the structure, a sandwich structure of a hard mask, a gate oxide, the first gate portion and the second gate portion may be obtained. Such geometry may be the result of an inclined/directional deposition procedure for forming the gate portions.

The channel region may be an intrinsic (that is free from an external doping) portion of a semiconductor material of which the fin is made. Such an intrinsic portion may have a synergetic double function for use as a channel for both the N- and the P-field effect transistors, rendering the device small in dimension and highly integratable.

The transistor device may be formed as a logic circuit and/or as a memory circuit. In both circuit types, transistors of both conductivities are useful. Referring to the example of a logic circuit, this may include an INVERTER, an AND gate, an OR gate, an XOR gate, or any other logic gate in accordance with a Boolean logic function.

In the following, exemplary embodiments of the method will be explained. However, these embodiments also apply to the transistor device.

The transistor device may be formed on the basis of a silicon-on-insulator (SOI) substrate. Such a silicon-on-insulator substrate may have a sandwich structure formed of a crystalline silicon substrate, a buried oxide layer and a thin surface silicon layer. Forming the transistor in SOI technology may have the advantage that only the upper silicon layer has to be processed for generating the fin. However, alternatively, also a crystalline silicon wafer may be used.

The first source/drain region may be formed by doping a corresponding portion of the fin with a dopant of the first type of conductivity, while a first mask layer covers the second source sandwich. This may allow for a selective doping of the first drain region with N- or P-dopant, for instance by ion implantation. The first mask layer may be a photoresist layer, etc.

In a similar manner, the second source/drain region may be formed by doping a corresponding portion of the fin with a dopant of the second type of conductivity, while a second mask layer covers the first source/drain region. Also, the second mask layer may be a photoresist or the like, preventing the already doped first source/drain region from being deteriorated by impurities from the complementary doping of the second source/drain region.

A first gate portion of the gate structure may be selectively formed aligned at least partially along a first vertical surface of the gate insulator by carrying out a first directive deposition procedure. A second gate portion of the gate structure may be selectively formed aligned at least partially along a second vertical surface of the gate insulator by carrying out a second directional position procedure. The term "directional deposition procedure" may denote a procedure by which material to be deposited on the wall of the gate insulator provided on the fin may impinge on the layer structure in an inclined manner, that is to say with an angle of more than zero degree (0°) against a normal direction of a main surface of the substrate. This may allow for an efficient generation of the two gate portions by using the fin as a shielding structure.

For any method step, any procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR or BIC-MOS may be implemented.

The device may be monolithically integrated in Silicon technology. As an alternative to Silicon technology, it is also possible to manufacture the transistor device in other semiconductor technologies, such as any other group IV semiconductor technology (for instance Germanium) or any group III-group V technology (for instance Gallium Arsenide).

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
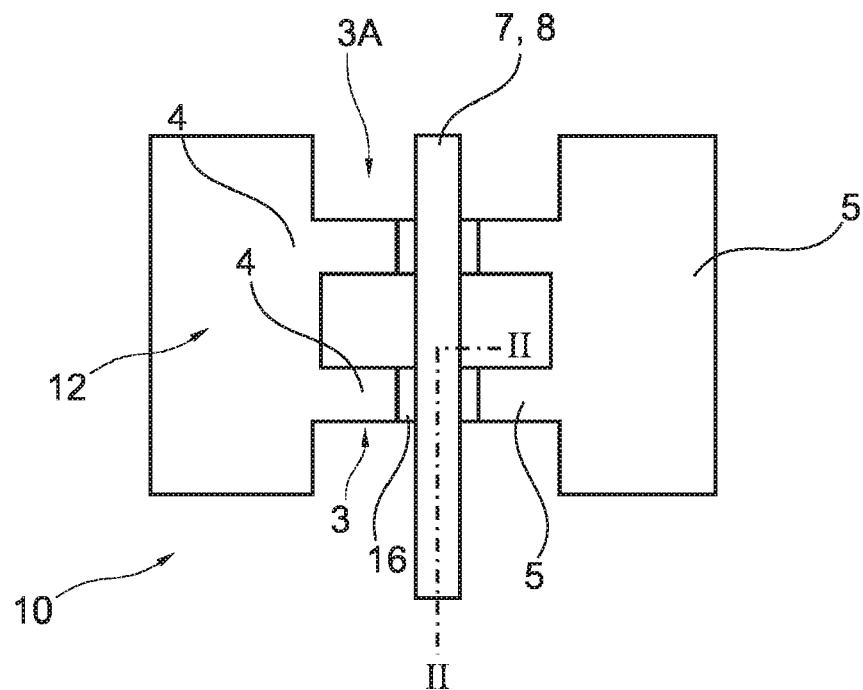
FIG. 1 shows a top view of an embodiment of a semiconductor sensor device according to an exemplary embodiment of the invention.

The figures are diagrammatic and not drawn to scale, the dimensions in the thickness direction being particularly exaggerated for greater clarity. Corresponding parts are generally given the same reference numerals and the same hatching in the various figures.

Figure 2:
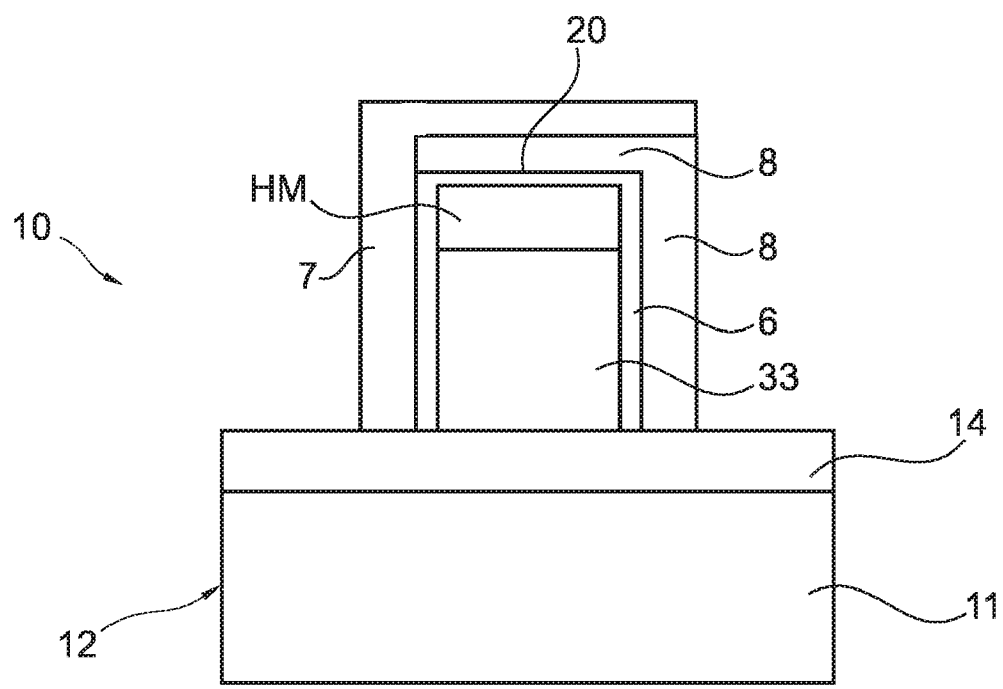
FIG. 2 shows a cross-section perpendicular to the thickness direction and along the line II-II of the semiconductor sensor device of FIG. 1.
Figure 3:
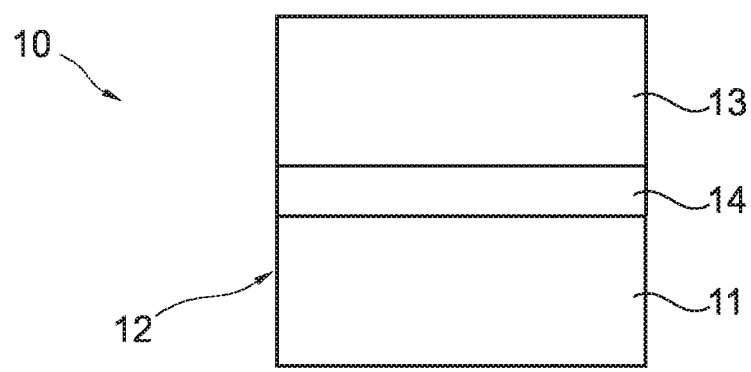
FIGS. 3 through 8 are sectional views of a part of the semiconductor sensor device of FIG. 1 at various stages in its manufacture by means of a method in accordance with an exemplary embodiment of the invention.
Figure 4:
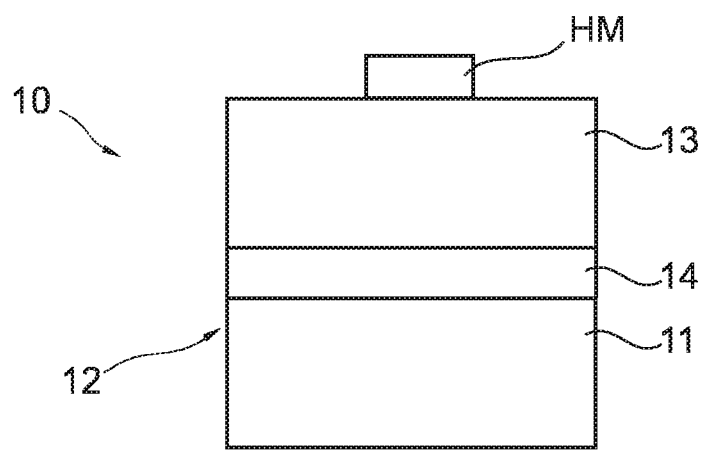
Figure 5:
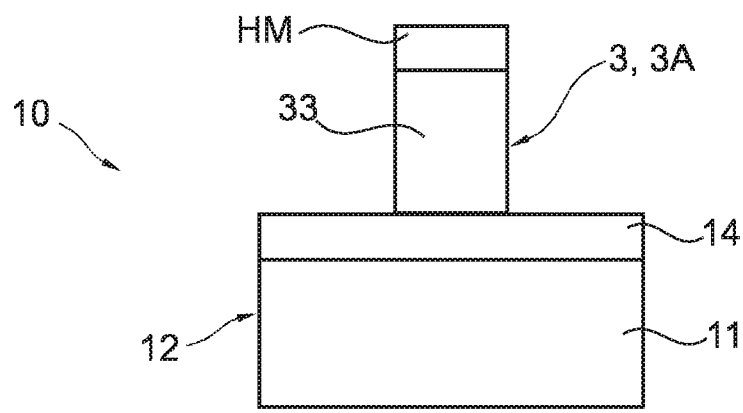
Figure 6:
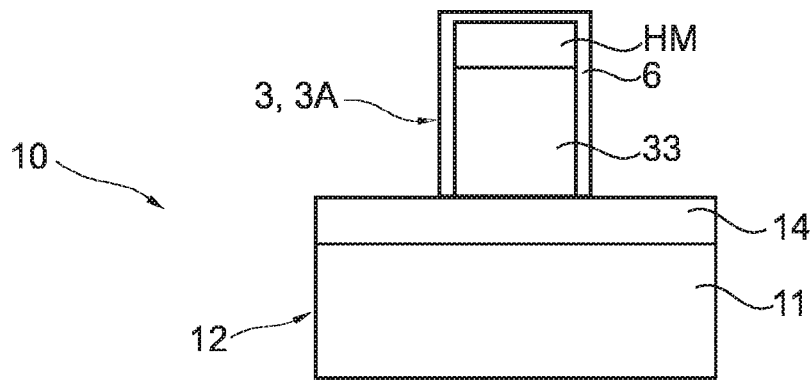
Figure 7:
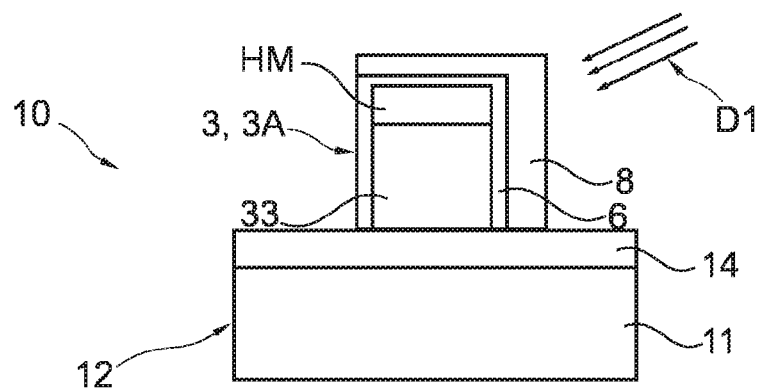
Figure 8:
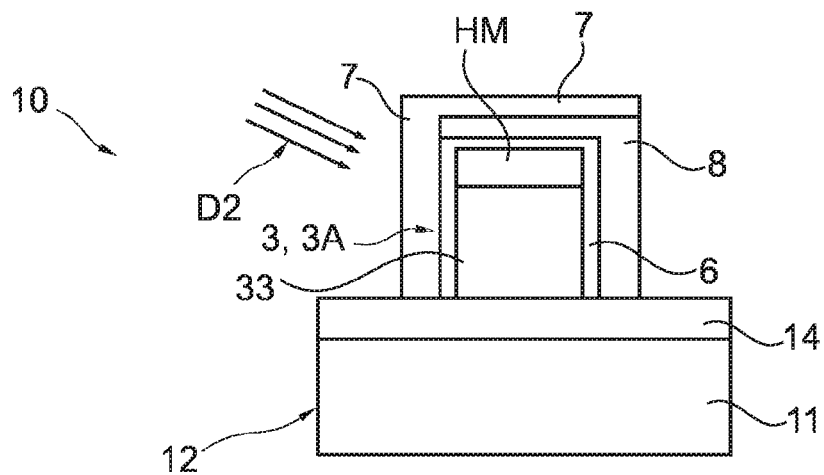

FIG. 1 shows a top view of an embodiment of a semiconductor sensor device according to an exemplary embodiment of the invention and FIG. 2 shows a cross-section perpendicular to the thickness direction and along the line II-II of the semiconductor sensor device of FIG. 1. The device 10 of this example comprises a substrate 11, in this case of intrinsic silicon which is coated with an electrically insulating layer 14 of silicon dioxide on top of which a silicon region 33 is present forming a part of the semiconductor body 12. The latter comprises a source region 4 (which may also be denoted as a first source/drain region), here of the P-type conductivity and a drain region 5 (which may also be denoted as a second source/drain region) of the opposite conductivity type, here of the N-type conductivity which are interconnected by means of a strip-shaped semiconductor region, here a plurality of strip-shaped semiconductor regions 3, 3A or fins which form an intrinsic, that is at most lowly doped, semiconductor channel region 33 of the FET of this example. Part of source and drain regions 4, 5 here is also present within the strip-shaped semiconductor regions 3, 3A.

In a direction perpendicular to the length direction of the strip-shaped semiconductor regions 3, 3A two gate regions 7, 8 are present. A first gate region 7 is present along a first vertical side face of the strip-shaped semiconductor region 3, 3A as well as on the upper horizontal side face thereof, said side faces being covered by a gate dielectric 6 (which may also be denoted as a gate insulator), here comprising a silicon dioxide layer. A second gate region 8 is present along a second vertical side face, opposite to the first vertical side face, of the strip-shaped semiconductor region 3, 3A as well also on the upper horizontal side face thereof, and in particular on a top surface 20 of the gate dielectric 6.

The transistor of this example forms a multiple FinFET in which each Fin 3, 3A comprises both an N-type TFET as well as a P-type TFET. As a result the device 10 is very compact and thus occupies relatively little area while the performance is excellent, for instance due to the absence of short-channel-effects and a low static leakage current. Both gate regions 7, 8 are interconnected in this example on the upper side face of the strip-shaped semiconductor region 3, 3A that in this example is covered by a hard mask region HM comprising for instance silicon dioxide or silicon nitride.

The first gate region 7 comprises a material of which the work function is such that it is appropriate or optimal for an N-(T)FET, while the gate region 8 comprises a different material of which the work function is such that it is appropriate or optimal for functioning as a gate region in a P(T)FET. Examples of metal or metal alloys that are suitable for gate region 7 are material having a work function somewhere in the range of 4.2+/−0.5 eV, for instance Ru, Zr, Nb, Ta, MoSi and TaSi. Suitable materials for the second gate region 8 are material having a work function somewhere in the range of 5.2+/−0.5 eV, examples of which are Ni, RuO2, MoN and TaN.

In this example, spacers 16, for instance of silicon dioxide, are present along the lateral side faces of gate regions 7, 8. The lateral dimensions of each channel region 33 are about 10 nm (width) and about 60 nm (height) in this example. The length of each strip-shaped region 3, 3A is about 75 nm, comprising 25 nm for each of the source, drain and gate region portions 4, 5, 7 and 8. The spacing between adjacent strip-shaped regions 3, 3A is about 50 nm. Further details of the device 10 of this example will be discussed below in the description of the manufacture of the device 10 by means of an embodiment of a method according to the invention.

Figure 9:
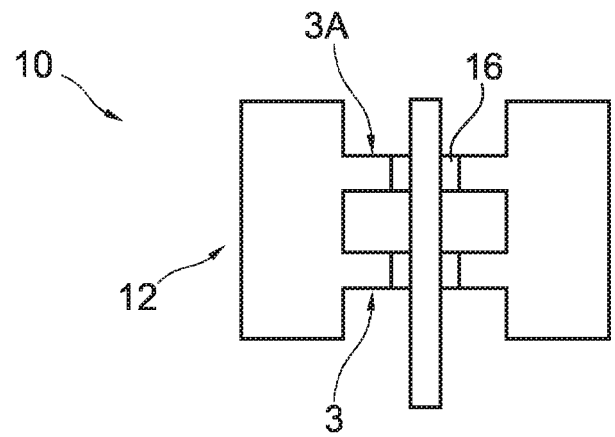
FIGS. 9 through 11 are top views of the semiconductor sensor device of FIG. 1 at various stages in its manufacture by means of a method in accordance with an exemplary embodiment of the invention.
Figure 10:
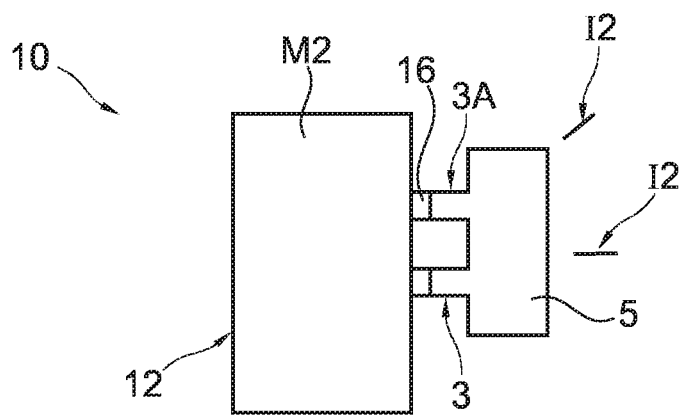
Figure 11:
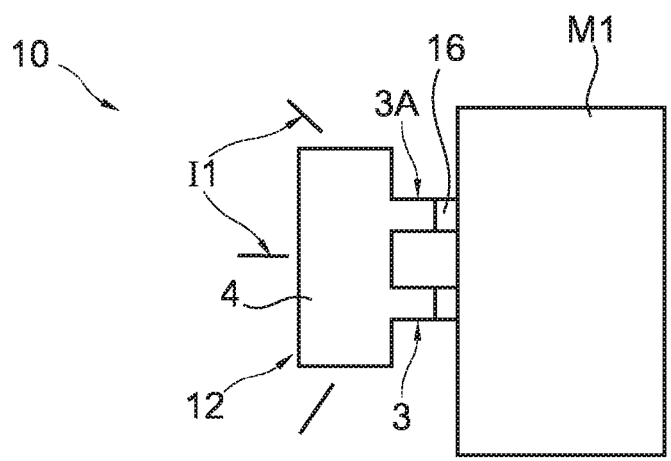

FIGS. 3 through 8 are sectional views of a part of the semiconductor sensor device of FIG. 1 at various stages in its manufacture by means of a method in accordance with an embodiment of the invention. FIGS. 9 through 11 are top views of a semiconductor sensor device of FIG. 1 at various stages in its manufacture by means of a method in accordance with an embodiment of the invention.

The starting point of the manufacture is (see FIG. 3) formed by an SOI structure 12 comprising a silicon substrate 11 in which a buried silicon dioxide region 14 is formed for instance by means of an implantation of oxygen ions. In this way, the upper part of the semiconductor body 12 forms an intrinsic silicon region/layer 13 in which a fin structure and source and drain regions are to be formed using (photo) lithography and etching.

For that purpose (see FIG. 4) use is made of hard mask layer HM comprising Si$_3$N$_4$ (Silicon Nitride) that is patterned using photolithography and etching. Etching is done in this example using a dry etching process like RIE (=Reactive Ion Etching). Wet etching may be used as well.

After etching (see FIG. 5), the channel region 33 is formed in a strip-shaped semiconductor region 3, 3A (the fin).

Subsequently (see FIG. 6) the fin region 3, 3A is provided with a gate dielectric 6 in the form of a silicon dioxide layer. The latter may be formed by deposition—as suggested in FIG. 6—but also use can be made of a thermal oxidation of the silicon region 33.

Next (see FIG. 7), a first directional process D1 is used for depositing on the upper side face and a vertical side face (in FIG. 7 on the right-hand side) of the strip-shaped semiconductor region 3, 3A a gate region 8 comprising for instance MoN (a molybdenum nitride). As a first directional process D1, for instance a sputtering method may be used.

This step is followed (see FIG. 8) by depositing another gate region 7 in a second directional deposition process D2. This second directional deposition process D2 in this case takes place from a direction opposite to the direction used in the first directional process D1. In this way, gate region 7 is formed covering also the upper horizontal side face of region 3, 3A and a vertical side face of the latter, however a vertical side face opposite to the vertical side face covered by the gate region 8.

In this example (see FIG. 9) spacers 16 are formed on two opposite lateral side faces of the first and second gate regions 7, 8. These spacers 16, comprising for instance silicon dioxide or silicon nitride, are here formed by depositing for instance by CVD (=Chemical Vapor Deposition) a layer of such a material after which the horizontal parts of such a layer are removed by etching.

Next (see FIG. 10) a mask M2 is provided over the left halve of the device 10 covering the source region to be formed and the gate regions 7, 8. The mask M2 may be formed by photolithography and may comprise a resist layer. The drain region 5 is then formed by an implantation step I2 by which N-type impurities, for instance As or P are implanted.

Subsequently (see FIG. 11) and after removal of the mask M2 a complimentary part of the device 10 is covered by a mask M1 similar to and formed in the same way as mask M1. Now the drain region 5 is formed by an implantation step I1 using dopant ions of the opposite conductivity type, that is of a p-type impurity such as Boron. After removal of the mask M1, the device is annealed for instance by a treatment at a temperature of about 1015 degrees Celsius during about 15/sec, thus in a so-called rapid thermal anneal step.

In a modification, the doping profile between the channel region and the source and/or drain is structured by using one or two spacers in a method slightly different from the one described above. A shallow source/drain implant is performed before formation of the spacers. The spacers are formed in such a case in two or four additional steps, implying that—while for instance the right part of the device is masked—a first left spacer is formed after a shallow source/drain implant and after formation of the first left spacer a deep(er) source/drain implant is performed. After removal of the mask and masking the left part of the device, a first right spacer is formed after a shallow drain/source implant and after formation of the first right spacer a deep(er) drain/source implant is performed. In case of using a second left and a second right spacer, formation of said spacers is preceded by an intermediate implant of which the depth lies for example between that of the shallow and the deep(er) implant. Preferably at least the doping profile near the transition between channel region and source/drain region that forms a tunneling junction is provided with such a single or double spacer treatment. In case the fin comprises a single TFET (implying that the channel region is either p or n-type doped), formation of the spacer(s) may be limited to only the left or right side of the device, that is to say the side where the tunneling junction is present. The number of manufacturing steps may thus be reduced in that way.

Finally, usual back end process steps—not shown in the drawing—are performed including the provision of a pattern of connection conductors and the use of a separation technique, such as sawing or etching in order to obtain individual devices 10 according to an embodiment of the invention.

Figure 12:
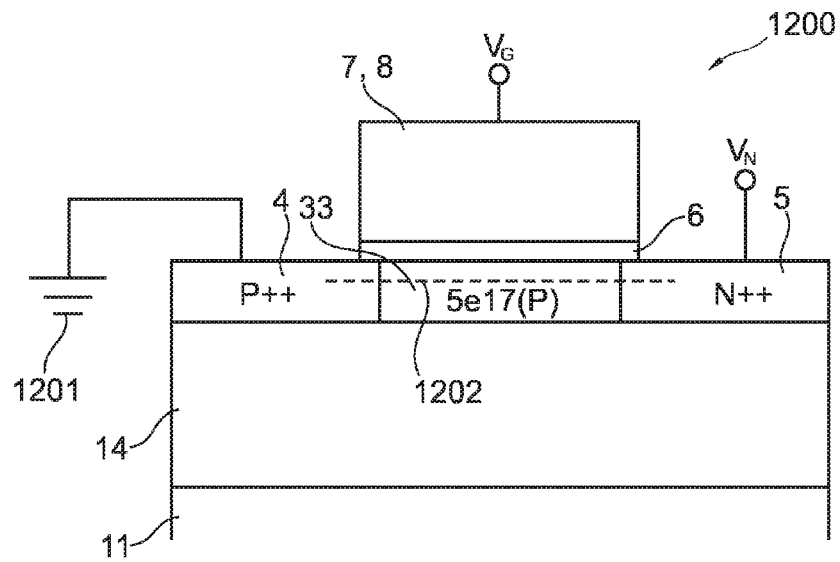
FIG. 12 shows a cut line for band diagrams for a transistor device.

FIG. 12 shows a schematic view of a device according to an exemplary embodiment of the invention.

In this very schematic view, a gate voltage $V_G$, a voltage $V_N$ to be applied to the second source/drain region 5 and a reference potential 1201 (for instance a ground potential) are shown as well. The buried oxide layer 14 is shown and also the intrinsic channel region 33 having a P-concentration of $5 \times 10^{17}$ cm$^{-2}$, for instance. A cut-line 1202 for the band diagrams shown in FIG. 13 is also shown.

Figure 13:
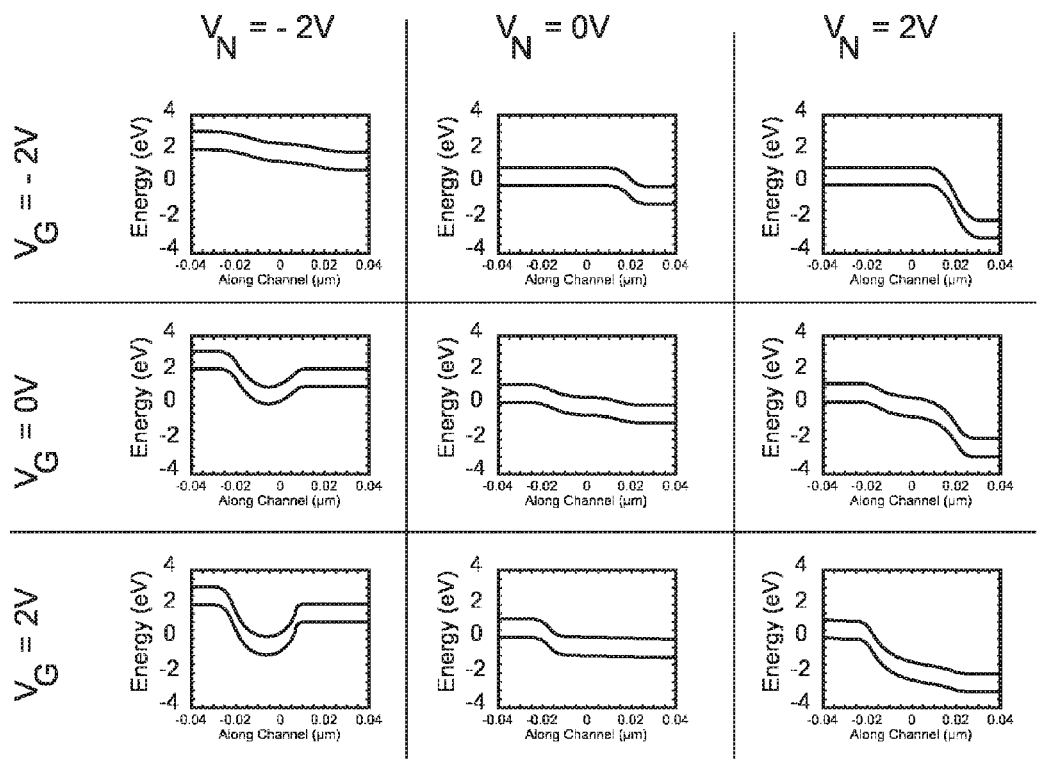
FIG. 13 shows band diagrams for a transistor device.

FIG. 13 shows different band diagrams for different bias conditions of a P++/silicon/N++ gated device. In detail, respective graphs of energy (in units eV) versus channel distance (in micrometers) is shown for $V_G$=-2V, $V_G$=0V, $V_G$=2V for each $V_N$=-2V, $V_N$=0V and $V_N$=2V. The graphs are scaled showing a range from -4 eV to +4 eV for the energy and a range from -0.04 micrometer to +0.04 micrometer for the distance (The distance to be understood as being centered at the middle of the gate region as shown in FIG. 12).

It will be obvious that the invention is not limited to the examples described herein, and that within the scope of the invention many variations and modifications are possible to those skilled in the art.

For example it is to be noted that the other sizes can be used and other materials than those mentioned in the examples. Furthermore it is noted that various modifications are possible with respect to individual manufacturing steps. For example other deposition techniques can be selected instead of those used in the examples.

The invention claimed is:

1. A transistor device, the transistor device comprising
a substrate;
a fin extending along a horizontal direction on the substrate;
a first source/drain region of a first type of conductivity in the fin;
a second source/drain region of a second type of conductivity in the fin, wherein the first type of conductivity differs from the second type of conductivity;
a channel region in the fin between the first source/drain region and the second source/drain region;
a gate insulator on the channel region, wherein the gate insulator is deposited on at least two vertical side surfaces and a horizontal top surface of the channel region;
a gate structure on the gate insulator, wherein the gate structure comprises at least two separately deposited portions, wherein the at least two separately deposited portions of the gate structure at least partially overlap on one of the surfaces of the channel region in a post-fabrication state of the transistor device; and
wherein, in the horizontal direction, the channel region extends between the first source/drain region and the second source/drain region.

2. The transistor device according to claim 1, wherein the first type of conductivity is opposite to the second type of conductivity.

3. The transistor device according to claim 1, adapted as a semiconductor transistor device.

4. The transistor device according to claim 3, wherein the semiconductor transistor device comprises a CMOS transistor device.

5. The transistor device according to claim 1, wherein the gate structure is a double gate structure.

6. The transistor device according to claim 5, wherein the double gate structure comprises a first gate portion located at least partially along a first vertical surface of the gate insulator and comprises a second gate portion located at least partially along a second vertical surface of the gate insulator.

7. The transistor device according to claim 6, wherein a material of the first gate portion differs from a material of the second gate portion.

8. The transistor device according to claim 7, wherein a work function of the material of the first gate portion is adapted to provide a characteristic of an N-type tunneling field effect transistor and a work function of the material of the second gate portion is adapted to provide a characteristic of a P-type tunneling field effect transistor.

9. The transistor device according to claim 6, wherein at least one of the group consisting of the first gate portion and the second gate portion is located partially along a horizontal surface of the gate insulator.

10. The transistor device according to claim 1, wherein the channel region is an intrinsic portion of a semiconductor material of which the fin is made.

11. The transistor device according to claim 1, formed as one of the group consisting of a logic circuit and a memory circuit.

12. The transistor device according to claim 1, wherein the first source/drain region and the second source/drain region are located at the same height level in the horizontal direction.

13. The transistor device according to claim 1, wherein the channel region, the first source/drain region and the second source/drain region are laterally neighbored along the horizontal direction.

14. The transistor device according to claim 1, wherein the at least two separately deposited portions of the gate structure overlap across a full distance of one of the surfaces of the channel region.

15. A method of manufacturing a transistor device, the method comprising:
  forming a fin extending along a horizontal direction on a substrate;
  forming a first source/drain region of a first type of conductivity in the fin;
  forming a second source/drain region of a second type of conductivity in the fin, wherein the first type of conductivity differs from the second type of conductivity;
  forming a channel region in the fin between the first source/drain region and the second source/drain region;
  forming a gate insulator on the channel region, wherein the gate insulator is deposited on at least two vertical side surfaces and a horizontal top surface of the channel region;
  forming a gate structure on the gate insulator, wherein the gate structure comprises at least two separately deposited portions according to first and second directional deposition procedures; and
  forming the sequence of the first source/drain region, the channel region and the second source/drain region to be aligned along the horizontal direction.

16. The method according to claim 15, wherein the transistor device is manufactured based on a silicon-on-insulator substrate.

17. The method according to claim 15, wherein the first source/drain region is formed by doping a corresponding portion of the fin with a dopant of the first type of conductivity while the second source/drain region is covered by a first mask layer, and/or the second source/drain region is formed by doping a corresponding portion of the fin with a dopant of the second type of conductivity while the first source/drain region is covered by a second mask layer.

18. The method according to claim 15, wherein a first gate portion of the gate structure is selectively formed extending at least partially along a first vertical surface of the gate insulator by carrying out the first directional deposition procedure, and/or a second gate portion of the gate structure is selectively formed extending at least partially along a second vertical surface of the gate insulator by carrying out the second directional deposition procedure.

19. The method according to claim 15, wherein the at least two separately deposited portions of the gate structure at least partially overlap on one of the surfaces of the channel region in a post-fabrication state of the transistor device.

20. The method according to claim 15, wherein forming the gate structure further comprises:
  sputtering a first portion toward a first vertical side surface of the gate insulator to form a first deposited portion on the first vertical side surface and a horizontal top surface of the gate insulator; and
  sputtering a second portion toward a second vertical side surface, opposite the first vertical side surface, of the gate insulator to form a second deposited portion on the second vertical side surface and the horizontal top surface of the gate insulator.

* * * * *